(12) United States Patent
Lee

(10) Patent No.: US 7,893,747 B2
(45) Date of Patent: Feb. 22, 2011

(54) CONTROL SIGNAL GENERATION CIRCUIT

(75) Inventor: Yin Jae Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/583,959

(22) Filed: Aug. 28, 2009

(65) Prior Publication Data

US 2010/0156480 A1  Jun. 24, 2010

(30) Foreign Application Priority Data

Dec. 23, 2008   (KR) .................. 10-2008-0132696

(51) Int. Cl.
*G06F 1/04* (2006.01)
(52) U.S. Cl. .................. 327/291; 327/171
(58) Field of Classification Search .......... None
See application file for complete search history.

(56) References Cited

U.S. PATENT DOCUMENTS

| 6,750,692 B2 * | 6/2004 | Jang ................ 327/291 |
| 7,523,270 B2 * | 4/2009 | Kim ................. 711/149 |
| 7,577,057 B2 * | 8/2009 | Lee et al. ............. 365/233.1 |
| 2002/0109538 A1 | 8/2002 | Yamauchi |
| 2008/0253205 A1 | 10/2008 | Park |

FOREIGN PATENT DOCUMENTS

| KR | 10-2006-0066203 | 6/2006 |
| KR | 10-2006-0034713 | 4/2008 |

* cited by examiner

*Primary Examiner*—Cassandra Cox
(74) *Attorney, Agent, or Firm*—John P. White; Cooper & Dunham LLP

(57) ABSTRACT

A control signal generation circuit includes a pulse signal generator configured to delay a column control signal by delay times different from each other and to generate first and second pulse signals, a reset signal generator configured to transfer alternatively the first and second pulse signals as a reset signal in response to a write/read flag signal, and a write-enable signal generator configured to generate a write-enable signal from the first pulse signal in response to the write/read flag signal.

10 Claims, 4 Drawing Sheets

US 7,893,747 B2

CONTROL SIGNAL GENERATION CIRCUIT

TECHNICAL FIELD

This disclosure relates to a control signal generation circuit of a semiconductor memory device.

BACKGROUND

FIG. 1 is a block diagram illustrating a configuration of a conventional semiconductor memory device.

The semiconductor memory device shown in FIG. 1 includes a memory cell CELL coupled to word lines WL0 and WL1 and a pair of bit lines BL and BLB (that is, bit line pair BL/BLB), a bit-line sense amplifier BLSA detecting data from the bit line pair BL/BLB, an input/output switch IOSW transferring data from the bit-line sense amplifier BLSA to a pair of local input/output lines LIO and LIOB (that is, local input/output pair LIO/LIOB) when an output-enable signal YI is enabled, a local input/output precharging circuit LIO PRECHARGE precharging the local input/output line pair LIO/LIOB to a precharge voltage in response to a reset signal LIORST, and a write driver WRITE DRIVER receiving data from a DQ pad (not shown) and activating the local input/output line pair LIO/LIOB in response to a write-enable signal BWEN during a writing operation.

In the semiconductor memory device of FIG. 1, the reset signal LIORST and the write-enable signal BWEN are generated in response to a column control signal YICTRL that is input as a pulse to generate the output-enable signal YI. In other words, the reset signal LIORST and the write-enable signal BWEN are generated by delaying the column control signal YICTRL (not shown) through delay paths provided thereto. As illustrated in FIG. 2, there is a period X for which the reset and write-enable signals LIORST and BWEN overlap each other in enabling term. In the period X, a current path is inadvertently formed to flow leakage current, incurring power dissipation.

Additionally, as shown in FIG. 2, there is a period t2-t3 for which data detected by the bit-line sense amplifier BLSA is interrupted to the local input/output line pair LIO/LIOB after an operation mode changes from a writing operation to a reading operation (t1) on the condition that the reset signal LIORST and the output-enable signal YI are disabled to low levels, and a precharging operation of the local input/output line pair LIO/LIOB is then completed. During this period t2-t3, as it is highly possible to induce a sensing fail due to noise while driving the bit-line sense amplifier BLSA, a sensing start time of the bit-line sense amplifier BLSA is usually delayed. However, delaying the sensing start time of the bit-line sense amplifier BLSA inevitably causes an operation rate to be lower.

Further, when the operation mode changes to the reading operation from the writing operation (t1), it is difficult to have a sufficient timing margin for precharging the local input/output line pair LIO/LIOB before the reading operation.

SUMMARY

In an embodiment of this disclosure, a control signal generation circuit includes a pulse signal generator configured to delay a column control signal by delay times different from each other and to generate first and second pulse signals, a reset signal generator configured to transfer alternatively the first and second pulse signals as a reset signal in response to a write/read flag signal, and a write-enable signal generator configured to generate a write-enable signal from the first pulse signal in response to the write/read flag signal.

BRIEF DESCRIPTION OF THE DRAWINGS

The above and other aspects, features and other advantages will be more clearly understood from the following detailed description taken in conjunction with the accompanying drawings, in which.

DESCRIPTION OF PREFERRED EMBODIMENTS

Hereinafter, embodiments of the present invention will be described with reference to accompanying drawings. However, the embodiments are for illustrative purposes only and are not intended to limit the scope of the invention.

Figure 1:
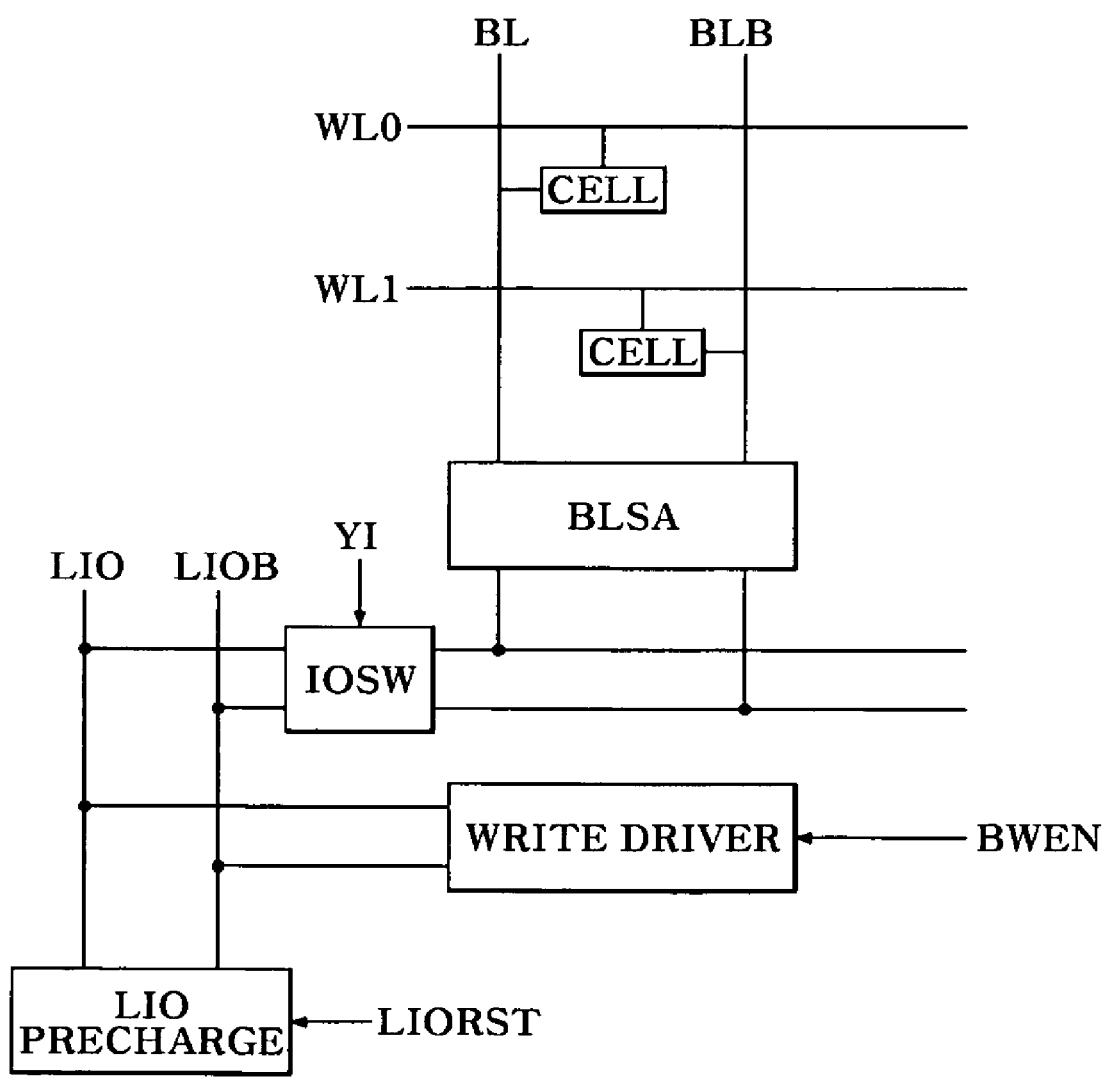
FIG. 1 is a block diagram illustrating a configuration of a conventional semiconductor memory device.
Figure 2:
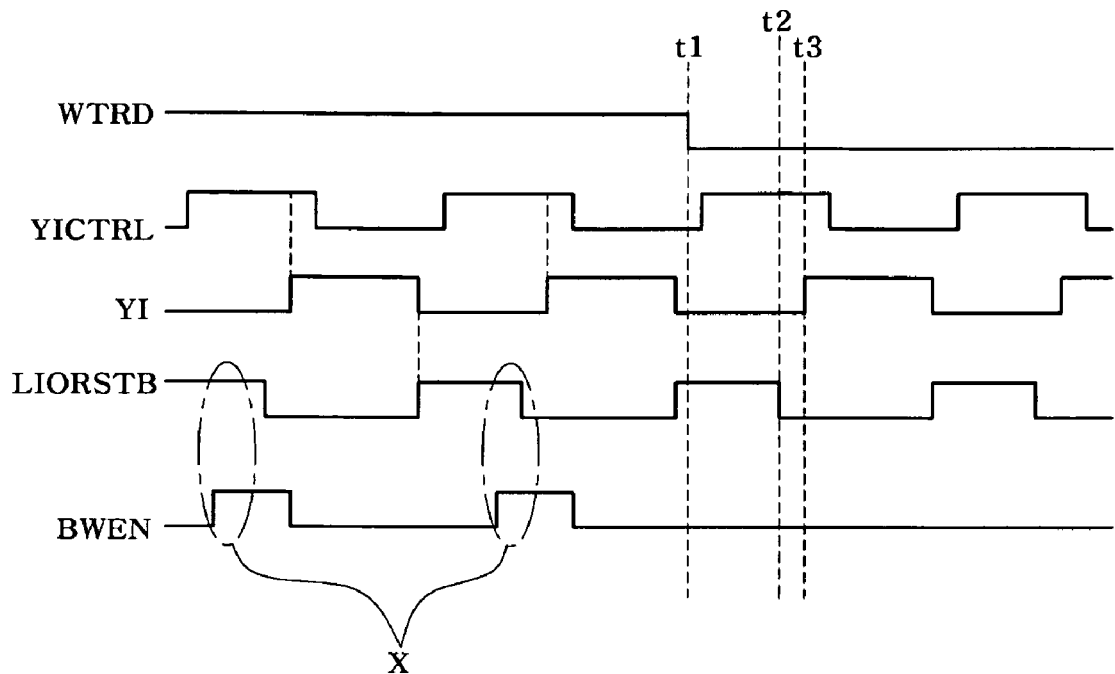
FIG. 2 is a timing diagram illustrating operating patterns of control signals during reading and writing operations in the semiconductor memory device shown in FIG. 1.
Figure 3:
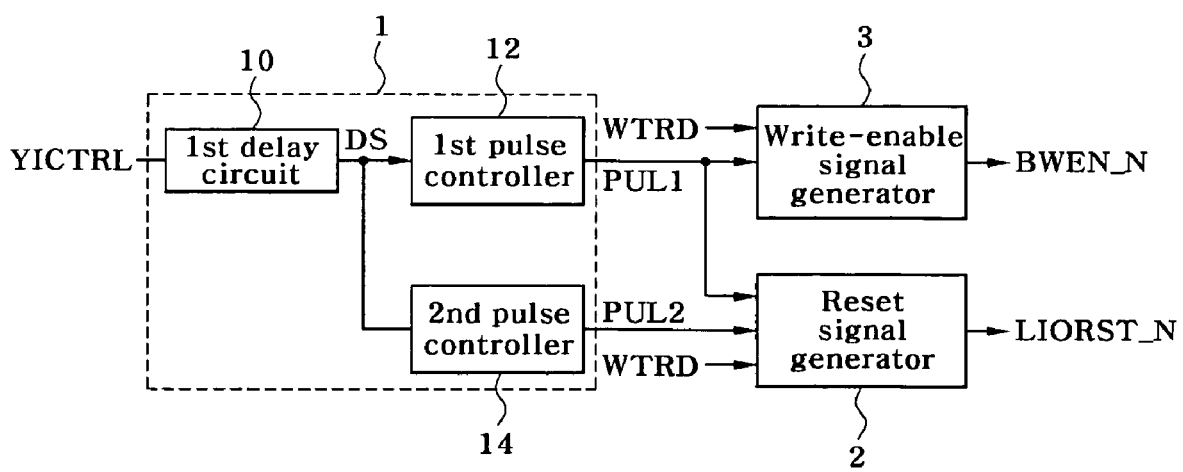
FIG. 3 is a block diagram illustrating a control signal generation circuit in accordance with an embodiment of the present invention.

FIG. 3 is a block diagram illustrating a control signal generation circuit in accordance with an embodiment of the present invention.

The control signal generation circuit shown in FIG. 3 includes a pulse signal generator 1, a reset signal generator 2, and a write-enable signal generator 3.

The pulse signal generator 1 includes a first delay circuit 10, a first pulse controller 12, and a second pulse controller 14. For an output-enable signal YI (FIG. 8), the first delay circuit 10 generates a delay signal DS by delaying a column control signal YICTRL, which is input as a pulse, by a first delay time.

Figure 4:
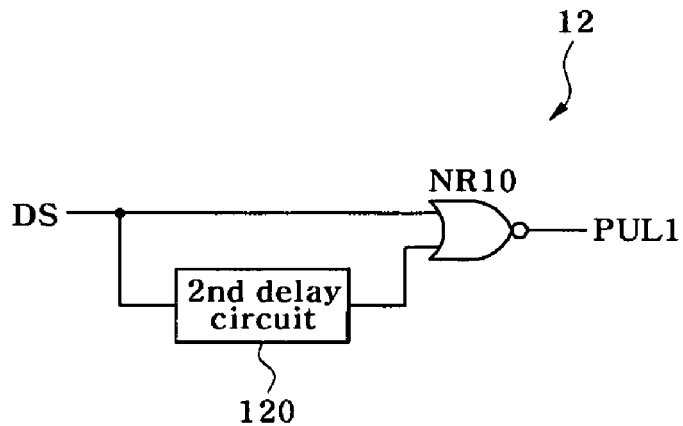
FIG. 4 is a circuit diagram illustrating a first pulse width controller of the control signal generation circuit shown in FIG. 3.

The first pulse controller 12, referring to FIG. 4, includes a second delay circuit 120 delaying the delay signal DS by a second delay time, and a NOR gate NR10 executing a NOR operation with the delay signal DS and an output signal of the second delay circuit 120. The first pulse controller 12 with this structure operates to generate a first pulse signal PUL1 that goes to a low level when one of the delay signal DS and the output signal of the second delay circuit 120 is at a high level. That is, the first pulse controller 12 generates the first pulse signal PUL1 that retains a low level for a time period longer than an enabling period of the delay signal DS by the second delay time.

Figure 5:
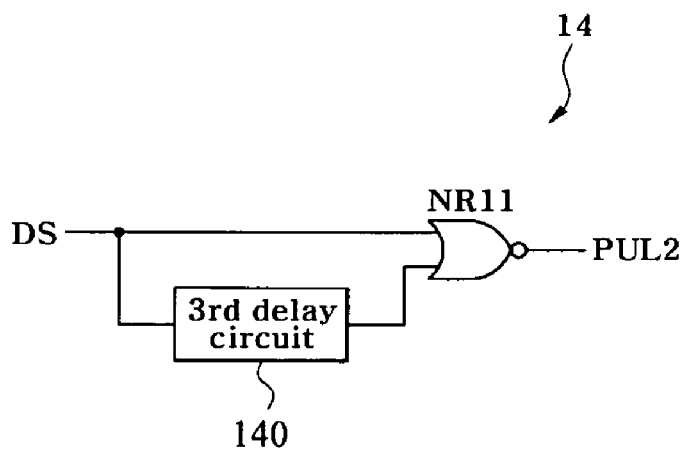
FIG. 5 is a circuit diagram illustrating a second pulse width controller of the control signal generation circuit shown in FIG. 3.

The second pulse controller 14, referring to FIG. 5, includes a third delay circuit 140 delaying the delay signal DS by a third delay time, and a NOR gate NR11 executing a NOR operation with the delay signal DS and an output signal of the third delay circuit 140. The second pulse controller 14 with this structure operates to generate a second pulse signal PUL2 that goes to a low level when one of the delay signal DS and the output signal of the third delay circuit 140 is at a high level. That is, the second pulse controller 14 generates the second pulse signal PUL2 that retains a low level for a time period longer than an enabling period of the delay signal DS by the third delay time. The second delay time may be longer than the third delay time and a low level period of the first pulse signal PUL1 may be longer than that of the second pulse signal PUL2.

Figure 6:
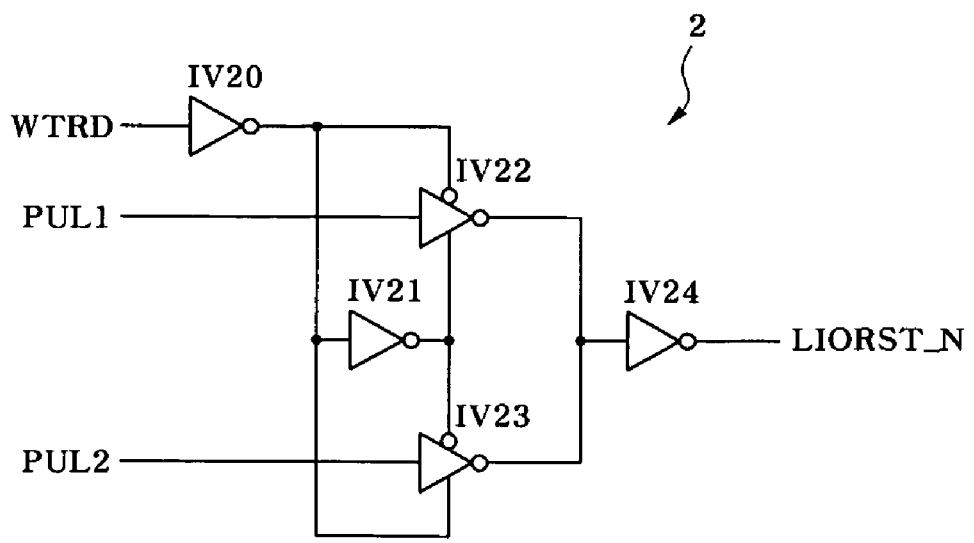
FIG. 6 is a circuit diagram illustrating a reset signal generator of the control signal generation circuit shown in FIG. 3.

Referring to FIG. 6, the reset signal generator 2 includes an inverter IV22 inverting the first pulse signal PUL1 in response to a write/read flag signal WTRD, an inverter IV23 inverting the second pulse signal PUL2 in response to the write/read flag signal WTRD, and an inverter IV24 inverting output signals of the inverters IV22 and IV23 and outputting a reset signal LIORST_N. Here, the write/read flag signal WTRD is laid on a high level in a writing operation, but a low level in a reading operation. Thus, the reset signal generator 2 outputs the first pulse signal PUL1 as the reset signal LIORST_N during the writing operation and outputs the second pulse signal PUL2 as the reset signal LIORST_N during the reading operation.

Figure 7:
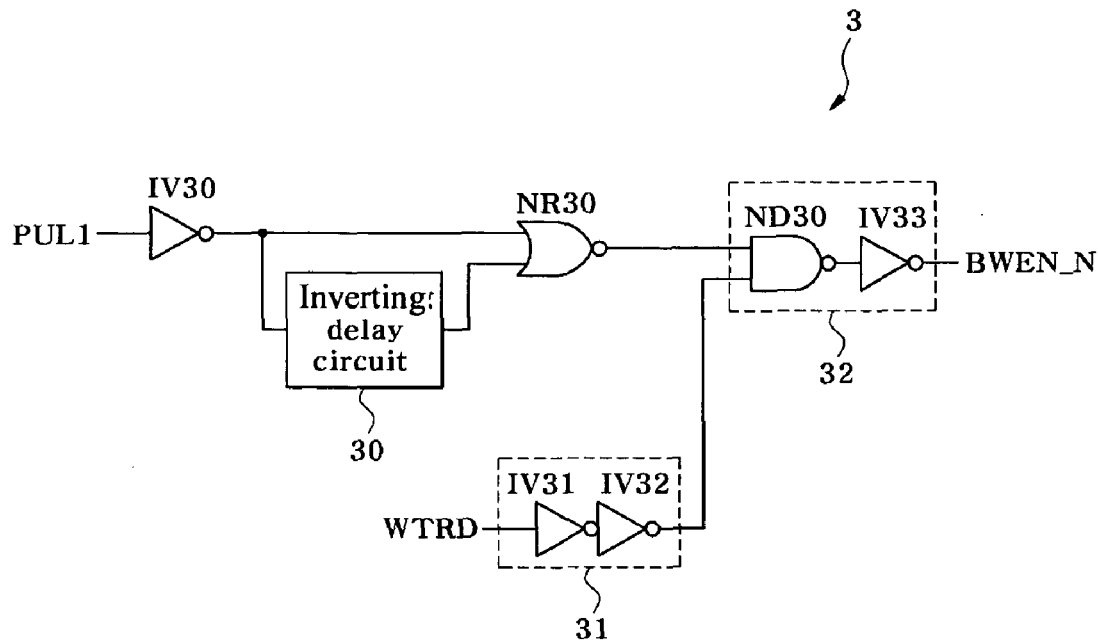
FIG. 7 is a circuit diagram illustrating a write-enable signal generator of the control signal generation circuit shown in FIG. 3.

The write-enable signal generator 3, referring to FIG. 7, includes an inverter IV30 inverting the first pulse signal PUL1, an inverting delay circuit 30 delaying and inverting an output signal by a predetermined delay time, a NOR gate NR30 executing a NOR operation with output signals of the inverter IV30 and the inverting delay circuit 30, a buffer 31 buffering the write/read flag signal WTRD, and a logic circuit executing an AND operation with output signals of the NOR gate NR30 and the buffer 31. The write-enable signal generator 3 with this organization is driven when the write/read flag signal WTRD is at a high level in the writing operation and generates the write-enable signal BWEN-N that is enabled to a high level for a predetermined time period in a period when the reset signal LIORST_N is being disabled at a low level.

Hereinafter, operation of the control generation circuit will be described.

First, the first delay circuit 10 of the pulse signal generator 1 delays the column control signal YICTRL, which is input as a pulse, by the first delay time and generates the delay signal DS. Next, the first pulse controller 12 receives the delay signal DS and generates the first pulse signal PUL1 that is maintained at a low level for a time period longer than the enabling period of the delay signal DS by the second delay time. The second pulse controller 14 generates the second pulse signal PUL2 that is maintained at a low level for a time period longer than the enabling period of the delay signal DS by the third delay time.

Next, the reset signal generator 2 generates the reset signal LIORST_N from the first pulse signal PUL1 or the second pulse signal PUL2 in response to the write/read flag signal WTRD. In further detail, during the writing operation, the write/read flag signal WTRD of high level activates the inverter IV22 while deactivating the inverter IV23, transferring the first pulse signal PUL1 as the reset signal LIORST_N. On the other hand, during the reading operation, the write/read flag signal WTRD of low level deactivates the inverter IV22 while activating the inverter IV23, transferring the second pulse signal PUL2 as the reset signal LIORST_N. As such, the reset signal LIORST_N from the reset signal generator 2 is operating with an enabling period that is shortened, in the writing operation more than in the reading operation, and with a disabling period that is lengthened.

The write-enable signal generator 3 operates when the write/read flag signal WTRD is input in a high level during the writing operation and generates the write-enable signal BWEN-N, which is enabled with a high level for a predetermined time period in a period when the reset signal LIORST_N is disabled in a low level, from the first pulse signal PUL1. As mentioned above, the write-enable signal generator 3 operates to generate the write-enable signal BWEN-N by means of the first pulse signal PUL1 transferred as the reset signal LIORST_N in the writing operation, so that it effects to make the enabling period of the reset signal LIORST_N does not overlap with an enabling period of the write-enable signal BWEN.

Figure 8:
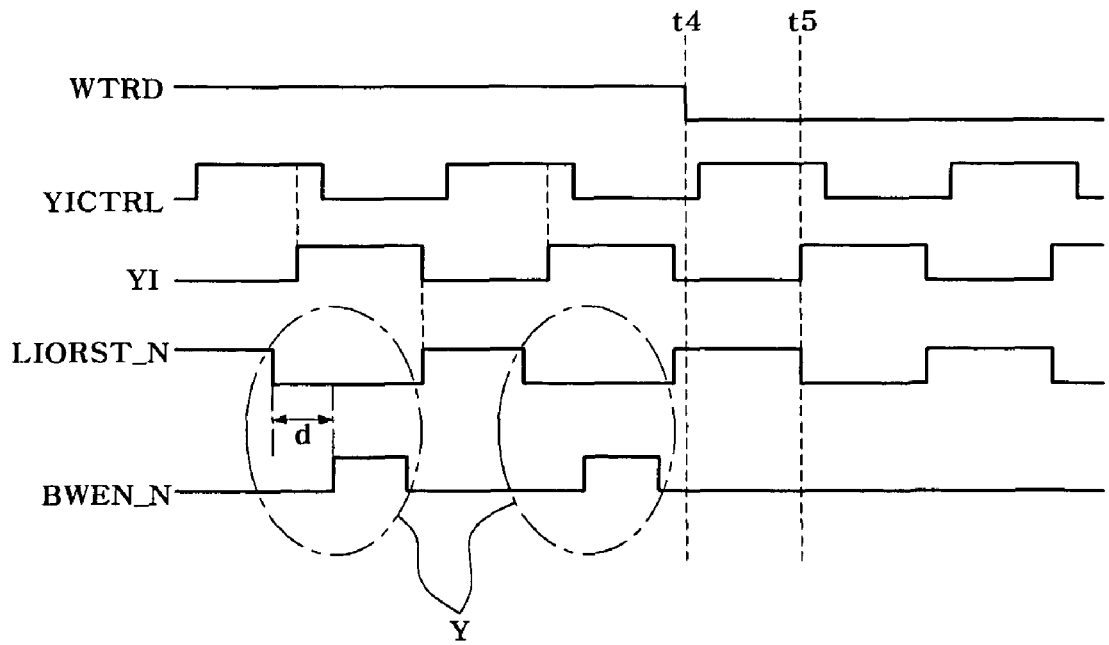
FIG. 8 is a timing diagram illustrating operating patterns of the reset and write-enable signals supplied from the control signal generation circuit shown in FIG. 3.

As shown by the portions Y of FIG. 8, it can be seen that the enabling periods of the reset signal LIORST_N generated from the control signal generation circuit depending to this embodiment do not overlap with the enabling period of the write-enable signal BWEN. In other words, the write-enable signal BWEN is enabled in a high level a time period d after the reset signal LIORST_N is disabled to a low level. Thus, the control signal generation circuit depending to this embodiment is effective in reducing power consumption because it is able to interrupt leakage current caused when both of the reset signal LIORST_N and the write-enable signal BWEN are enabled to high levels.

Also, as can be seen from a period t4-t5 of FIG. 8, the enabling period of the reset signal LIORST_N, at a high level, extends to be longer in the reading operation than in the writing operation, changing the operation mode to the reading operation from the writing operation. This is because the reset signal LIORST_N is transferred and generated in the reading operation. As stated above, since the enabling period of the reset signal LIORST_N becomes longer in the reading operation, it is possible to secure a sufficient margin for precharging the local input/output line pair LIO/LIOB. Moreover, as the enabling period of the reset signal LIORST_N is lengthened and the output-enable signal YI is enabled to a high level after the reset signal LIORST_N is disabled to a low level, it is possible to prevent an operation rate from degrading because there is no need to delay a sensing start time of the bit-line sense amplifier BLSA.

While the present invention has been described with respect to the specific embodiments, it will be apparent to those skilled in the art that various changes and modifications may be made without departing from the spirit and scope of the invention as defined in the following claims.

The present application claims priority to Korean application number 10-2008-0132696, filed on Dec. 23, 2008, which is incorporated by reference in its entirety.

What is claimed is:

1. A control signal generation circuit, comprising:
a pulse signal generator configured to delay a column control signal by delay times different from each other and to generate first and second pulse signals;
a reset signal generator configured to transfer alternatively the first and second pulse signals as a reset signal in response to a write/read flag signal; and
a write-enable signal generator configured to generate a write-enable signal from the first pulse signal in response to the write/read flag signal,
wherein the write-enable signal is enabled when the reset signal is disabled.

2. The control signal generation circuit of claim 1, wherein the pulse signal generator comprises:
a first delay circuit configured to delay the column control signal by a first delay time and to generate a delay signal;

a first pulse controller configured to adjust a pulse width of the delay signal and to generate the first pulse signal; and a second pulse controller configured to adjust a pulse width of the delay signal and to generate the second pulse signal.

3. The control signal generation circuit of claim 2, wherein the first pulse controller comprises:

a second delay circuit configured to delay the delay signal by a second delay time; and a first logic circuit configured to conduct a logical operation with the delay signal and an output signal of the second delay circuit.

4. The control signal generation circuit of claim 3, wherein the second pulse controller comprises:

a third delay circuit configured to delay the delay signal by a third delay time; and a second logic circuit configured to conduct a logical operation with the delay signal and an output signal of the third delay circuit.

5. The control signal generation circuit of claim 4, wherein the second delay time is longer than the third delay time.

6. The control signal generation circuit of claim 4, wherein the first and second logic circuit execute NOR operations.

7. The control signal generation circuit of claim 1, wherein the reset signal generator comprises:

a first device configured to transfer the first pulse signal as the reset signal in response to the write/read flag signal at a first level; and a second device configured to transfer the second pulse signal as the reset signal in response to the write/read flag signal at a second level.

8. The control signal generation circuit of claim 7, wherein the first and second devices are alternatively driven in response to the write/read flag signal.

9. The control signal generation circuit of claim 1, wherein the write-enable signal generator comprises:

an inverting delay circuit configured to delay inversely an inverse signal of the first pulse signal by a predetermined delay time;

a first logic circuit configured to conduct a logical operation with the inverse signal of the first pulse signal and an output signal of the inverting delay circuit; and a second logic circuit configured to buffer an output signal of the first logic circuit, in response to the write/read flag signal, and to transfer the output signal of the first logic circuit as the write-enable signal.

10. The control signal generation circuit of claim 9, wherein the first logic circuit executes a NOR operation and the second logic circuit executes an AND operation.

* * * * *